United States Patent
Minami et al.

(10) Patent No.: US 10,644,505 B2
(45) Date of Patent: May 5, 2020

(54) TECHNIQUE FOR EVALUATING AN OUTPUT PERFORMANCE OF AN ELECTRIC POWER OUTPUT APPARATUS CONNECTED TO AN ELECTRIC POWER DISTRIBUTION NETWORK

(71) Applicant: NEC Corporation, Tokyo (JP)

(72) Inventors: Kouichi Minami, Tokyo (JP); Hidekazu Kimura, Tokyo (JP)

(73) Assignee: NEC Corporation, Tokyo (JP)

(*) Notice: Subject to any disclaimer, the term of this patent is extended or adjusted under 35 U.S.C. 154(b) by 59 days.

(21) Appl. No.: 16/080,913

(22) PCT Filed: Feb. 10, 2017

(86) PCT No.: PCT/JP2017/004873
§ 371 (c)(1),
(2) Date: Aug. 29, 2018

(87) PCT Pub. No.: WO2017/150139
PCT Pub. Date: Sep. 8, 2017

(65) Prior Publication Data
US 2019/0067942 A1 Feb. 28, 2019

(30) Foreign Application Priority Data
Mar. 4, 2016 (JP) .................. 2016-042201

(51) Int. Cl.
*G06Q 50/06* (2012.01)
*H02J 3/00* (2006.01)
(Continued)

(52) U.S. Cl.
CPC .......... *H02J 3/005* (2013.01); *G01R 19/2513* (2013.01); *G01R 21/002* (2013.01);
(Continued)

(58) Field of Classification Search
CPC .................................................. G06Q 50/06
(Continued)

(56) References Cited

U.S. PATENT DOCUMENTS

| | | | | |
|---|---|---|---|---|
| 6,380,715 B1* | 4/2002 | Kubo | ............ | H01M 10/44 320/128 |
| 2005/0015283 A1* | 1/2005 | Iino | ............ | G06Q 10/06315 705/4 |

(Continued)

FOREIGN PATENT DOCUMENTS

| | | |
|---|---|---|
| JP | 2004-273316 | 9/2004 |
| JP | 2011-198317 | 10/2011 |

(Continued)

OTHER PUBLICATIONS

International Search Report dated Apr. 18, 2017, in corresponding PCT International Application.

*Primary Examiner* — Suresh Suryawanshi
(74) *Attorney, Agent, or Firm* — Finnegan, Henderson, Farabow, Garrett & Dunner, L.L.P.

(57) ABSTRACT

Provided is a server (10) including an attribute information receiving unit (15) which receives attribute information of an electric power output apparatus (30) from the electric power output apparatus (30) having a function of outputting electric power; an output condition transmitting unit (18) which transmits an output condition determined in accordance with the attribute information to the electric power output apparatus (30); a processing result receiving unit (16) which receives a processing result obtained by performing predetermined processing on output waveform data at the time when the electric power output apparatus (30) outputs electric power according to the output condition; and an evaluating unit (17) which evaluates an electric power output performance of the electric power output apparatus (Continued)

(30) on the basis of the processing result and the output condition.

18 Claims, 11 Drawing Sheets

(51) Int. Cl.
*H02J 3/50* (2006.01)
*H02J 3/24* (2006.01)
*G01R 21/133* (2006.01)
*H02J 3/48* (2006.01)
*G01R 19/25* (2006.01)
*H02J 13/00* (2006.01)
*H02J 3/12* (2006.01)
*G01R 31/40* (2020.01)
*G01R 21/00* (2006.01)
*H02J 3/14* (2006.01)
*H02J 3/32* (2006.01)
*H02J 3/38* (2006.01)

(52) U.S. Cl.
CPC ......... *G01R 21/003* (2013.01); *G01R 21/006* (2013.01); *G01R 21/133* (2013.01); *G01R 31/40* (2013.01); *H02J 3/12* (2013.01); *H02J 3/14* (2013.01); *H02J 3/24* (2013.01); *H02J 3/48* (2013.01); *H02J 3/50* (2013.01); *H02J 13/0006* (2013.01); *G01R 19/2506* (2013.01); *H02J 3/32* (2013.01); *H02J 3/382* (2013.01); *H02J 13/0075* (2013.01); *H02J 13/0079* (2013.01); *H02J 2003/003* (2013.01); *H02J 2003/007* (2013.01); *Y02E 40/72* (2013.01); *Y04S 10/12* (2013.01)

(58) Field of Classification Search
USPC .......................................................... 700/286
See application file for complete search history.

(56) References Cited

U.S. PATENT DOCUMENTS

| | | | |
|---|---|---|---|
| 2009/0096416 A1* | 4/2009 | Tonegawa | B60L 53/305 320/109 |
| 2012/0191263 A1* | 7/2012 | Kuniyosi | H02J 3/383 700/286 |
| 2013/0245850 A1 | 9/2013 | Okayama et al. | |
| 2016/0003918 A1* | 1/2016 | Wada | H02J 3/32 320/134 |
| 2018/0323630 A1* | 11/2018 | Nakamura | H01M 10/44 |
| 2019/0214823 A1* | 7/2019 | Viehweider | H02J 3/00 |

FOREIGN PATENT DOCUMENTS

| | | |
|---|---|---|
| JP | 2012-253976 | 12/2012 |
| JP | 2013143678 A * | 7/2013 |
| JP | 2013-192401 | 9/2013 |
| WO | WO 2011/135813 | 11/2011 |
| WO | WO 2012/056581 | 5/2012 |

* cited by examiner

FIG 4

| OUTPUT CONDITION ID | ACTIVE ELECTRIC POWER | REACTIVE ELECTRIC POWER | VOLTAGE | FREQUENCY | RAMP | ... |
|---|---|---|---|---|---|---|
| .... | .... | .... | .... | .... | .... | .... |

FIG. 5

| ELECTRIC POWER OUTPUT PROCESSING (MODEL NAME) | OUTPUT CONDITION ID |
|---|---|
| ABC0001 | . . . |
| ⋮ | ⋮ |

FIG. 6

OUTPUT CONDITION ID : · · · · · ·

| ALLOWABLE RANGE | | | | | | |
|---|---|---|---|---|---|---|
| ABC0001 | | · · · | BQ32CC | | | · · |
| ACTIVE ELECTRIC POWER | REACTIVE ELECTRIC POWER | | ACTIVE ELECTRIC POWER | REACTIVE ELECTRIC POWER | · · | |
| · · · · | · · · · | · · · · | · · · · | · · · · | · · · · | · · · · |

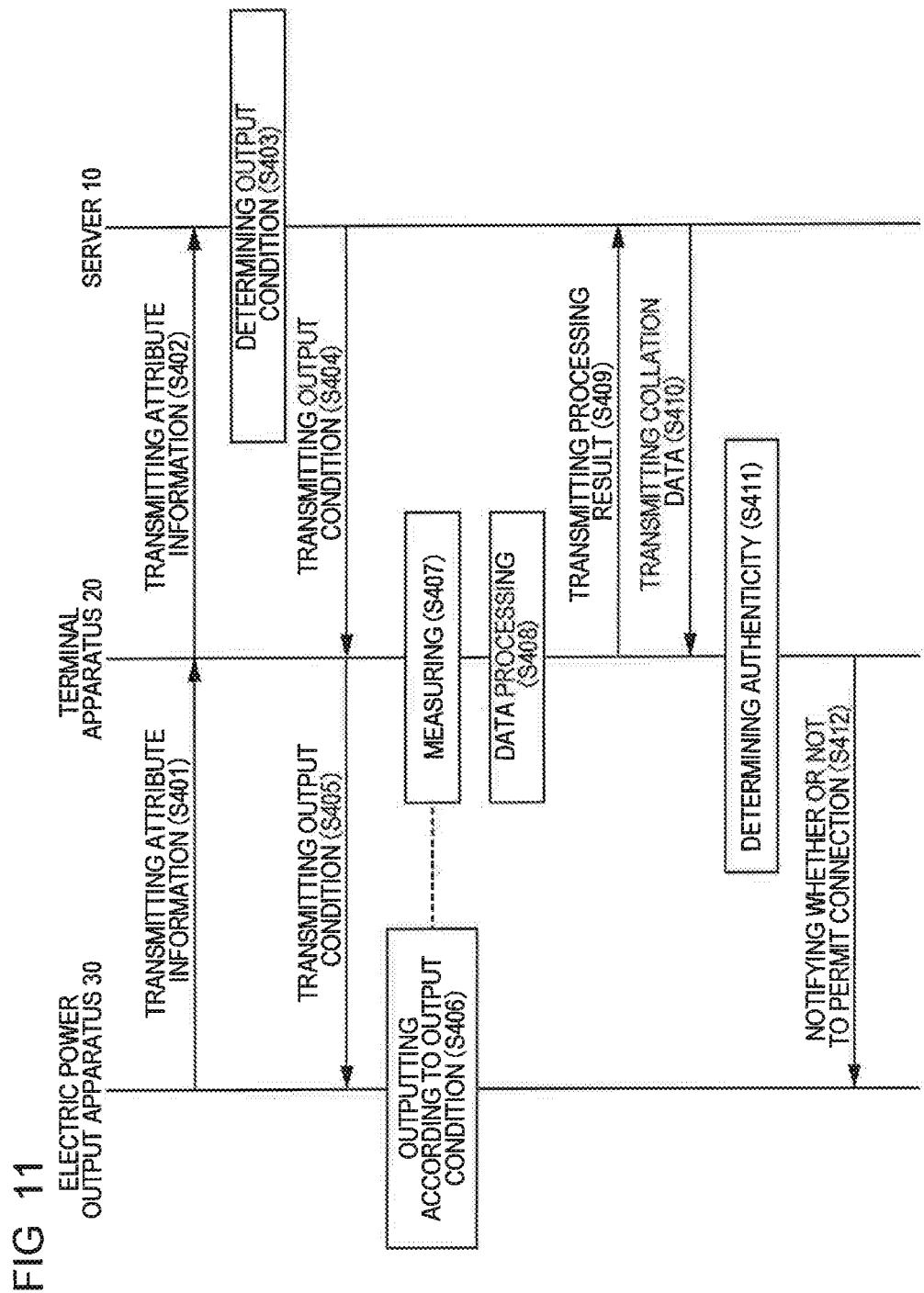

TECHNIQUE FOR EVALUATING AN OUTPUT PERFORMANCE OF AN ELECTRIC POWER OUTPUT APPARATUS CONNECTED TO AN ELECTRIC POWER DISTRIBUTION NETWORK

CROSS-REFERENCE TO RELATED PATENT APPLICATIONS

This application is a National Stage Entry of International Application No. PCT/JP2017/004873, filed Feb. 10, 2017, which claims priority from Japanese Patent Application No. 2016-042201, filed Mar. 4, 2016. The entire contents of the above-referenced applications are expressly incorporated herein by reference.

TECHNICAL FIELD

The present invention relates to a terminal apparatus, a control apparatus, a server, an evaluation method, and a program.

BACKGROUND ART

Various electric power output apparatuses (for example, a storage battery, an electric power generation apparatus, and the like) on the demand side are connected to an electric power distribution network through devices such as a Home Energy Management System (HEMS) and distribution boards. An electric power company has received, from the manufacturer of various electric power output apparatuses, information related to a manufacturer name, a model name, a rated capacity, a rated electric power, and the like of each apparatus, and has performed an examination conforming to interconnection regulations on each apparatus. After going through such an examination, each apparatus is connected to the electric power distribution network, and each apparatus was used for a service operation such as demand response.

Related techniques are disclosed in Patent Documents 1 to 3.

Patent Document 1 discloses a server including a measurement information storage unit which stores a history of measured electric characteristic information for each secondary battery, and a battery state determining unit which determines the state of the secondary battery by comparing measured electric characteristic information of a secondary battery with the electric characteristic information for the same secondary battery stored in the measurement information storage unit.

The electric characteristic is a current value, a voltage value, an electric power energy, or the like at the time of charging the secondary battery, and is measured by the measuring unit. The measuring unit measures the electric characteristics between an electric power supply unit and the secondary battery (see FIG. 6 of Patent Document 1, and the like). The electric power supply converts an alternating current into a direct current and supplies electricity to a secondary battery using the converted direct current.

Patent Document 2 discloses a charging and discharging control apparatus including: a charging and discharging unit which is connected to an in-vehicle storage battery and performs charging or discharging on the in-vehicle storage battery, a storage unit which stores identification information for each of plural types of in-vehicle storage batteries and characteristic information indicating a predetermined characteristic of a corresponding type of in-vehicle storage battery in association with each other, an information acquiring unit which acquires from the outside target identification information which is identification information of a target in-vehicle storage battery connected to the charging and discharging unit, and a charging and discharging control unit which executes charging control or discharging control on the charging and discharging unit, on the basis of the target characteristic information associated with the target identification information of the characteristic information stored in the storage unit.

Patent Document 3 discloses a Physically Unclonable Function (PUF) device, and a PUF reader that performs the extraction of a PUF parameter necessary for calculating a response output from a challenge input by analyzing the operation of the PUF device, and performs the extraction of an operation parameter for characterizing an operation state by observing an electric power waveform, an electromagnetic wave system waveform or processing time of the PUF device at that time, and performs the authentication of the PUF device on the basis of each of the extracted parameters. The PUF reader monitors operation of the PUF device during response generation on the basis of the operation parameter and determines an authenticity of whether the PUF device is a valid PUF device or not.

RELATED DOCUMENT

Patent Document

[Patent Document 1] WO2011/135813
[Patent Document 2] Japanese Patent Application Publication No. 2012-253976
[Patent Document 3] Japanese Patent Application Publication No. 2011-198317

SUMMARY OF THE INVENTION

Technical Problem

In the future, it is expected that a rapid increase in number of electric power output apparatuses connected to the electric power distribution network will make it physically difficult to perform the above-described examination (examination or the like conforming to interconnection regulations) on all electric power output apparatuses. In a case where electric power output apparatuses are allowed to be connected to the electric power distribution network without going through the examination, an electric output apparatus of poor quality may be connected to the electric power distribution network as well.

In such an electric power output apparatus, for example, even though an output operation of a predetermined value is performed according to a discharging instruction from the electric power company, actual output may fall below a predetermined value in some cases. Occurrence of such a situation may hinder operation of a service such as demand response.

In the technique described in Patent Document 1, the electric characteristic is measured by observing a direct current waveform as a target, and the performance of a battery cell and a battery module is evaluated. However, the technique described in Patent Document 1 cannot perform an evaluation on the output performance of a battery system, that is, an evaluation on the performance of a power conditioner and an evaluation on the performance of the entire battery system including the power conditioner. Techniques described in Patent Documents 2 and 3 do not disclose any means for resolving the problem either.

An object of the present invention is to provide means for solving the problem.

Solution to Problem

According to the present invention, there is provided a control apparatus including:

an attribute information receiving unit which receives attribute information of an electric power output apparatus from the electric power output apparatus having a function of outputting electric power;

an output condition transmitting unit which transmits an output condition determined in accordance with the attribute information to the electric power output apparatus;

a processing result receiving unit which receives a processing result obtained by performing predetermined processing on output waveform data at the time when the electric power output apparatus outputs electric power according to the output condition; and an evaluating unit which evaluates an electric power output performance of the electric power output apparatus on the basis of the processing result and the output condition.

According to the present invention, a server having the control apparatus is provided. The server may be, for example, a server in a cloud (so-called cloud server).

According to the present invention, there is provided a terminal apparatus including:

an attribute information receiving unit which receives attribute information of an electric power output apparatus from the electric power output apparatus having a function of outputting electric power;

an output condition transmitting unit which transmits an output condition determined in accordance with the attribute information to the electric power output apparatus;

an output data receiving unit which receives output waveform data at the time when the electric power output apparatus outputs electric power according to the output condition; and an output unit which transmits a processing result obtained by performing predetermined processing on the output waveform data on the basis of the output condition.

According to the present invention, there is provided an evaluation method which is executed by a computer, including:

an attribute information receiving step of receiving attribute information of an electric power output apparatus from the electric power output apparatus having a function of outputting electric power;

an output condition transmitting step of transmitting, to the electric power output apparatus, an output condition determined in accordance with the attribute information;

a processing result receiving step of receiving a processing result obtained by performing predetermined processing on output waveform data at the time when the electric power output apparatus outputs electric power according to the output condition; and an evaluating step of evaluating an electric power output performance of the electric power output apparatus on the basis of the processing result and the output condition.

According to the present invention, there is provided an evaluation method which is executed by a computer, including:

an attribute information receiving step of receiving attribute information of an electric power output apparatus from the electric power output apparatus having a function of outputting electric power;

an output condition transmitting step of transmitting, to the electric power output apparatus, an output condition determined in accordance with the attribute information;

an output data receiving step of receiving output waveform data at the time when the electric power output apparatus outputs electric power according to the output condition; and an output step of transmitting a processing result obtained by performing predetermined processing on the output waveform data on the basis of the output condition.

According to the present invention, there is provided a program that causes a computer to function as:

an attribute information receiving unit which receives attribute information of an electric power output apparatus from the electric power output apparatus having a function of outputting electric power;

an output condition transmitting unit which transmits, to the electric power output apparatus, an output condition determined in accordance with the attribute information;

a processing result receiving unit which receives a processing result obtained by performing predetermined processing on output waveform data at the time when the electric power output apparatus outputs electric power according to the output condition; and an evaluating unit which evaluates an electric power output performance of the electric power output apparatus on the basis of the processing result and the output condition.

According to the present invention, there is provided a program that causes a computer to function as:

an attribute information receiving unit which receives attribute information of an electric power output apparatus from the electric power output apparatus having a function of outputting electric power;

an output condition transmitting unit which transmits, to the electric power output apparatus, an output condition determined in accordance with the attribute information;

an output data receiving unit which receives output waveform data at the time when the electric power output apparatus outputs electric power according to the output condition; and an output unit which transmits a processing result obtained by performing predetermined processing on the output waveform data on the basis of the output condition.

Advantageous Effects of Invention

According to the present invention, a technique for evaluating an output performance of an electric power output apparatus connected to an electric power distribution network is realized.

BRIEF DESCRIPTION OF THE DRAWINGS

The above objects and other objects, features and advantages will become more apparent from the following description of the preferred example embodiments and the accompanying drawings below.

FIG. 4 is a diagram schematically illustrating an example of information managed by a server according to the example embodiment.

FIG. 5 is a diagram schematically illustrating an example of information managed by a server according to the example embodiment.

FIG. 6 is a diagram schematically illustrating an example of information managed by a server according to the example embodiment.

FIG. 11 is a sequence diagram illustrating an example of a processing flow of the management system according to the example embodiment.

DESCRIPTION OF EMBODIMENTS

First, an example of the hardware configuration of the apparatuses (a terminal apparatus and a server) of the example embodiment will be described. Each unit provided by the apparatus according to the example embodiment is realized with any combination of hardware and software of any computer centering on a Central Processing Unit (CPU), a memory, a program to be loaded into the memory, and a storage unit such as a hard disk which stores the program (which stores programs downloaded from a storage medium such as a Compact Disc (CD), or a server, and the like on the Internet, in addition to a program stored in advance from the stage of shipping the apparatus), and a network connection interface. It is understood by those skilled in the art that there are various modification examples to the realization method and apparatus.

Figure 1:
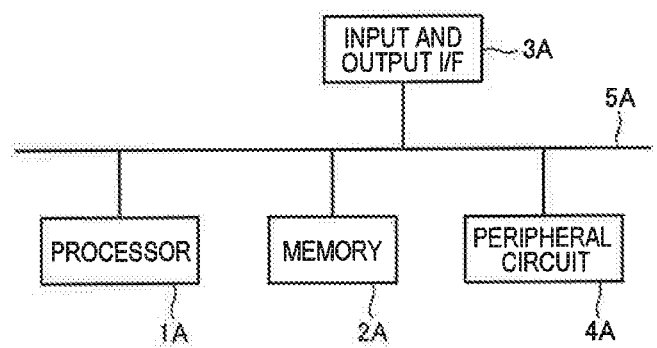
FIG. 1 is a diagram conceptually illustrating an example of a hardware configuration of an apparatus according to an example embodiment.

FIG. 1 is a block diagram illustrating a hardware configuration of the apparatus according to the example embodiment. As illustrated in FIG. 1, the apparatus has a processor 1A, a memory 2A, an input and output interface 3A, a peripheral circuit 4A, and a bus 5A. The peripheral circuit includes various modules.

The bus 5A is a data transmission path through which the processor 1A, the memory 2A, the peripheral circuit 4A and the input and output interface 3A mutually transmit and receive data. The processor 1A is an arithmetic processing device such as a Central Processing Unit (CPU) or a Graphics Processing Unit (GPU). The memory 2A is a memory such as a Random Access Memory (RAM) or a Read Only Memory (ROM). The input and output interface 3A includes an interface for acquiring information from an external apparatus, an external server, an external sensor, or the like. The processor 1A issues a command to each module and performs an operation based on arithmetic results thereof.

It should be noted that, in the present specification, "receiving" includes at least one of (actively acquiring) that an apparatus itself acquires data or information stored in another apparatus or a storage medium, for example, that the apparatus itself receives data or information by making a request or inquiry to another apparatus, or reads out data or information by making an access to another apparatus or a storage medium, or the like, and (passively receiving) that data or information output from another apparatus is input to the apparatus, for example, that distributed (or transmitted, push notified, and the like) data or information are received, or the like. The "receiving" also includes selecting and acquiring data or information from among the received data or information, or selecting and receiving the distributed data or information.

Hereinafter, the example embodiment will be described. Note that, the functional block diagrams used in the description of the example embodiments below are not illustrated as a unit of a hardware configuration but a functional unit of a block. In these drawings, it is described that each apparatus is realized by one piece of equipment, but a unit for realizing each apparatus is not limited thereto. That is, each apparatus may have a physically separated configuration or a logically separated configuration. Note that, the same components are denoted by the same reference numerals, and the descriptions thereof will not be repeated.

First Example Embodiment

Figure 2:
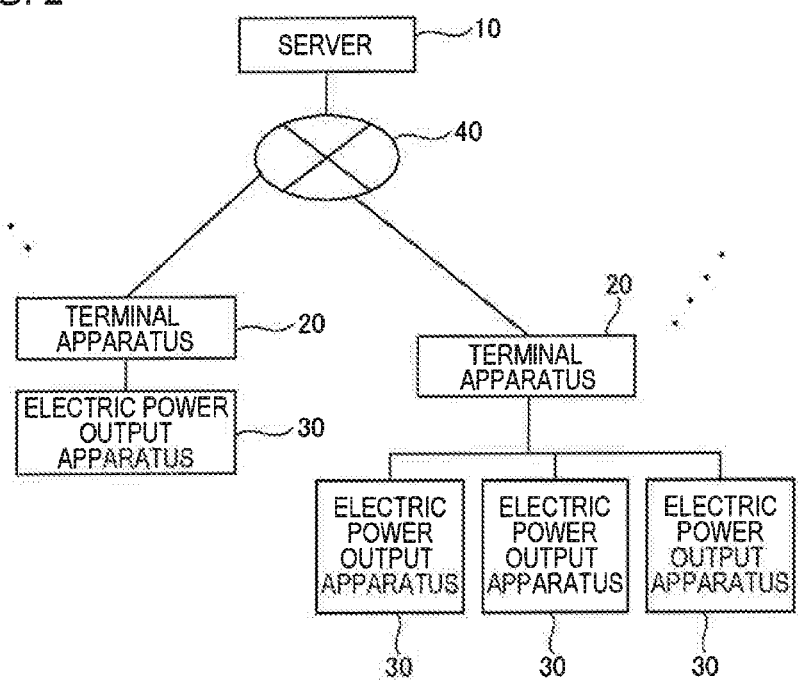
FIG. 2 is a diagram for describing an overall image of a management system according to the example embodiment.

First, with reference to FIG. 2, the overall image of the management system according to the example embodiment will be described. As illustrated in the figure, the management system includes a server (control apparatus) 10, a terminal apparatus 20, and an electric power output apparatus 30. As illustrated in the figure, the server 10 and the terminal apparatus 20 are connected to a network 40 such as the Internet, so that information may be mutually transmitted and received. The terminal apparatus 20 and the electric power output apparatus 30 are connected through wired and/or wireless connection, and it is possible to transmit and receive information according to any communication standard.

The electric power output apparatus 30 has a function of outputting electric power to supply electric power to the electric power distribution network. The electric power output apparatus 30 may have a function of receiving electric power supply from the electric power distribution network to accumulate energy. For example, the electric power output apparatus 30 corresponds to a storage battery, an electric power generation apparatus (for example, an electric power generation apparatus that generates electric power using natural energy), and the like, but is not limited thereto. Each electric power output apparatus 30 is managed by, for example, an electric power generation business operator or a general user.

The terminal apparatus 20 has a function of controlling the operation of the electric power output apparatus 30, collecting information from the electric power output apparatus 30, and transmitting the information to the server 10. As illustrated in the figure, one terminal apparatus 20 may be installed corresponding to one electric power output apparatus 30, or one terminal apparatus 20 may be installed corresponding to plural electric power output apparatuses 30. The terminal apparatus 20 and the electric power output apparatus 30 may be physically integrated or be configured separately.

The server 10 is managed by an electric power company. The server 10 may control the operation of the electric power output apparatus 30 through the terminal apparatus 20 and execute a service such as demand response. For example, the server 10 makes to the terminal apparatus 20 an output request (request for electric power supply to the electric power distribution network) of predetermined electric power. The terminal apparatus 20 controls a subordinate electric power output apparatus 30 such that the electric power output apparatus performs output according to the output request.

The management system according to the example embodiment has a unit which evaluates electric power output performance of the electric power output apparatus 30. In the server 10 and the terminal apparatus 20, it is possible to realize output conforming to the output request from the server 10 by controlling the operation of each electric power output apparatus 30 on the basis of the evaluation result. Hereinafter, the configuration of each apparatus will be described in detail.

Figure 3:
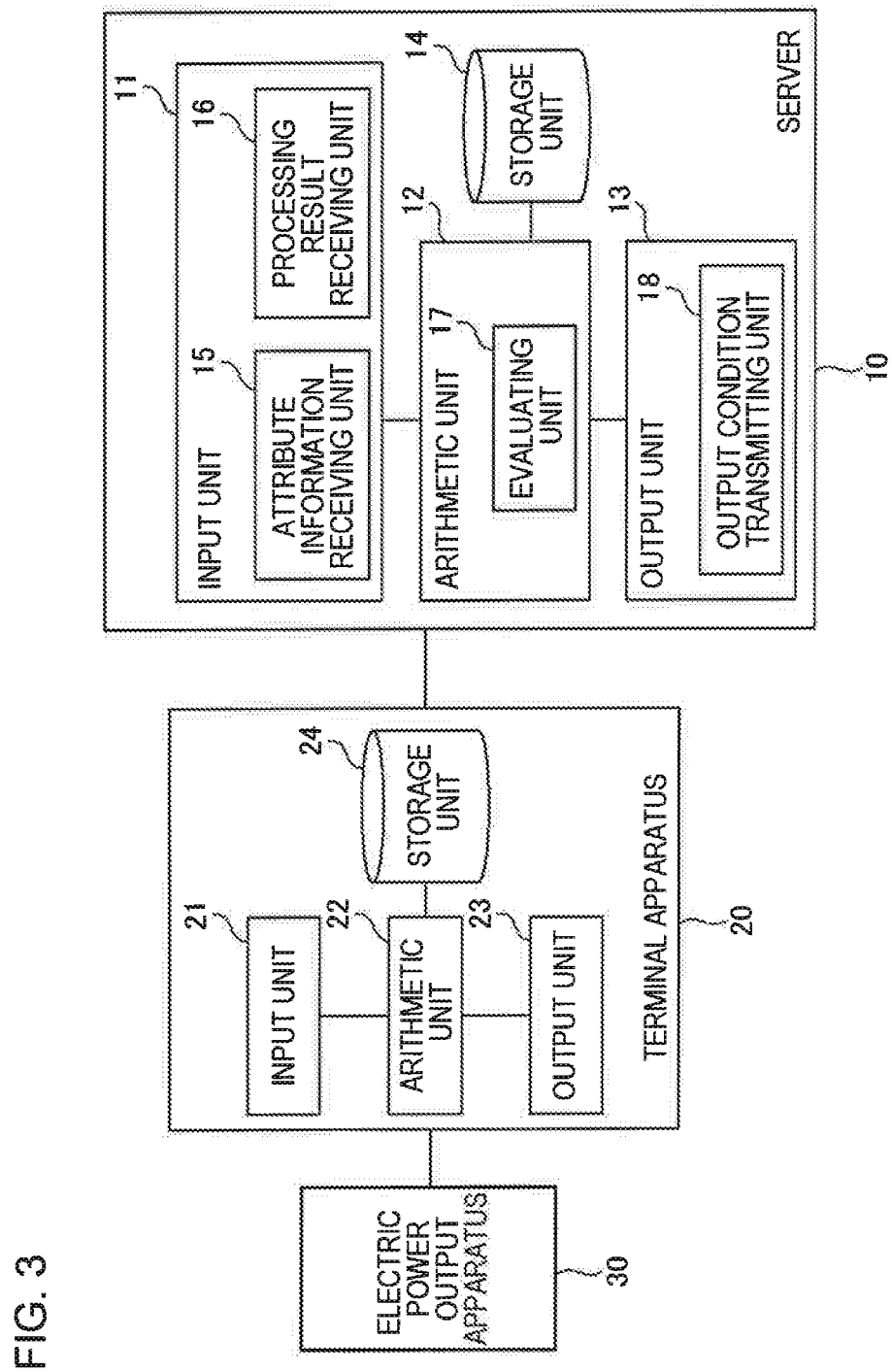
FIG. 3 is an example of a functional block diagram of a management system according to the example embodiment.

FIG. 3 illustrates an example of a functional block diagram of the management system according to the example embodiment. As illustrated, the terminal apparatus 20 includes an input unit 21, an arithmetic unit 22, an output unit 23, and a storage unit 24. The input unit 21 receives an input of data. The arithmetic unit 22 performs predetermined arithmetic processing. The output unit 23 outputs data. The storage unit 24 stores data. Explanation of specific processing performed by each unit of the terminal apparatus 20 is appropriately performed at the time of describing the configuration of the following server 10.

The server 10 includes an input unit 11, an arithmetic unit 12, an output unit 13, and a storage unit 14. The input unit 11 receives an input of data. The arithmetic unit 12 performs predetermined arithmetic processing. The output unit 13 outputs data. The storage unit 14 stores data. The input unit 11 includes an attribute information receiving unit 15 and a processing result receiving unit 16. The arithmetic unit 12 includes an evaluating unit 17. The output unit 13 has an output condition transmitting unit 18.

The attribute information receiving unit 15 receives from the electric power output apparatus 30 attribute information of the own apparatus (electric power output apparatus 30). The attribute information receiving unit 15 receives the attribute information from the electric power output apparatus 30 through the terminal apparatus 20. The attribute information includes, for example, a manufacturer (brand-name), a model name, date of manufacture, and the like. Such attribute information is registered in advance on each electric power output apparatus 30. The electric power output apparatus 30 transmits the attribute information to the terminal apparatus 20 at a predetermined timing. When the terminal apparatus 20 receives the attribute information from the electric power output apparatus 30 (input unit 21), the terminal apparatus 20 transmits the received attribute information to the server 10 (output unit 23).

For example, in a case where the electric power output apparatus 30 is newly connected to the electric power distribution network, the electric power output apparatus 30 and any terminal apparatus 20 may be communicated to each other as preparation for the new connection. The electric power output apparatus 30 is set as an apparatus to be controlled by the terminal apparatus 20. Such preparation allows the terminal apparatus 20 to control an operation of the electric power output apparatus 30. The operation to be controlled is an operation of outputting electric power from a power conditioner provided in the electric power output apparatus 30 to the electric power distribution network, or taking electric power from the electric power distribution network into the power conditioner, and so on.

The timing of transmitting the attribute information from the electric power output apparatus 30 to the terminal apparatus 20 depends on a matter of design. For example, after the completion of setting the electric power output apparatus 30 as the apparatus to be controlled, the electric power output apparatus 30 may transmit the attribute information to the terminal apparatus 20 at an arbitrary timing. For example, the electric power output apparatus 30 may transmit the attribute information of the own apparatus to the terminal apparatus 20 according to a predetermined operation on the terminal apparatus 20 or the electric power output apparatus 30 by an operator. Besides, according to the completion of setting the electric power output apparatus 30 as the apparatus to be controlled, the terminal apparatus 20 may make a request for attribute information to the electric power output apparatus 30 at a predetermined timing after the completion. Then, the electric power output apparatus 30 may transmit the attribute information of the own apparatus to the terminal apparatus 20 in response to the request.

The timing of transmission of the attribute information is not limited to when the electric power output apparatus 30 is newly connected to the electric power distribution network. For example, after being connected to the electric power distribution network, the electric power output apparatus 30 may transmit the attribute information of the own apparatus to the terminal apparatus 20 at a preset predetermined timing, periodically (for example, once a year, once every three months, and the like).

The output condition transmitting unit 18 transmits the output condition determined in accordance with the attribute information received by the attribute information receiving unit 15 to the electric power output apparatus 30 through the terminal apparatus 20.

In the output condition, for example, a value (specified value) of at least one item of active electric power, reactive electric power, a voltage, a frequency, and a change amount (ramp) of electric power during a predetermined time is specified. As details thereof will be described below, the electric power output apparatus 30 performs an output operation (test operation) of electric power according to the output condition. Then, the output performance of the electric power output apparatus 30 is evaluated on the basis of the output condition and the output result of the electric power output apparatus 30 according to the output condition.

In the example embodiment, the storage unit 14 stores plural output conditions in advance. The arithmetic unit 12 searches the storage unit 14 using the attribute information transmitted from the terminal apparatus 20 as a key, and retrieves, from among the plural output conditions previously stored in the storage unit 14, an output condition corresponding to the received attribute information. In this manner, the output condition transmitting unit 18 transmits, through the terminal apparatus 20, the output condition retrieved by the arithmetic unit 12 to the electric power output apparatus 30.

Here, FIG. 4 and FIG. 5 schematically illustrate an example of information stored in the storage unit 14. FIG. 4 illustrates output condition information on which details of plural output conditions are registered. In association with an output condition ID (identifier), values (specified values) of active electric power, reactive electric power, a voltage, a frequency, and ramp are associated with one another.

FIG. 5 indicates information where model names of electric power output apparatuses 30 and IDs of output conditions applied to each model name are associated to each other. Note that, one output condition may be applied to only the one electric power output apparatus 30 or may be applied to plural electric power output apparatuses 30. The output condition, for example, may be in accordance with the capability of the power conditioner of the electric power output apparatus 30. In such a case, the same output condition is applied to plural electric power output apparatuses 30 including a power conditioner with the same or an equivalent capability.

Returning to FIG. 3, the processing result receiving unit 16 receives a processing result obtained by performing predetermined processing on output waveform data in a case where the electric power output apparatus 30 outputs electric power according to the output condition. The processing result receiving unit 16 receives the processing result from the terminal apparatus 20.

The electric power output apparatus 30 that received the output condition performs an output operation (test operation) of electric power according to the output condition. That is, the electric power output apparatus 30 performs an output operation so as to output electric power at the specified value of one item or each of plural items defined in the output condition.

Then, the terminal apparatus 20 receives the output waveform data at the time when the electric power output apparatus 30 outputs electric power according to the output condition (input unit 21). Specifically, the terminal apparatus 20 receives alternating current waveform data (for example, current waveform data) output from the power conditioner of the electric power output apparatus 30. For example, the terminal apparatus 20 receives the alternating current waveform data from a measuring sensor which is installed at any position at which the alternating current waveform data can be measured. Note that, the terminal apparatus 20 and the power conditioner, which is connected to the electric power output apparatus 30, are connected to the same electric power line. For this reason, the terminal apparatus 20 may receive an output waveform (alternating current waveform data) output from the power conditioner.

Thereafter, the terminal apparatus 20 performs predetermined arithmetic processing on the received alternating current waveform data (arithmetic unit 22). As a result of the arithmetic processing, values (measured values) such as active electric power, reactive electric power, a voltage, a frequency, and a ramp are obtained. The terminal apparatus 20 transmits these values as a processing result to the server 10 (output unit 23).

The evaluating unit 17 evaluates the electric power output performance of the electric power output apparatus 30 on the basis of the processing result and the output condition. The evaluating unit 17 evaluates a response performance of the electric power output apparatus 30 with respect to the specified value of the predetermined item. That is, it is evaluated as an indication whether or not output is performed at the specified value, or how much there is a deviation from the specified value, and the like. Hereinafter, an example of the evaluation method will be described.

For example, the server 10 may store reference information indicating, for each output condition, the standard range within which the value (measured value) of each item falls in a case where a normal (not deteriorated, failed, and the like) electric power output apparatus 30 performs an output operation of electric power according to the output condition (storage unit 14). FIG. 6 schematically illustrates an example of reference information. In the figure, in association with one output condition, there is defined an allowable range of the output result of one electric power output apparatus or each of plural electric power output apparatuses 30 to which the output condition is applied. Reference information as illustrated in FIG. 6 is prepared for each output condition.

The evaluating unit 17 checks whether the measured value of each item indicated by the processing result falls within the allowable range corresponding to the output condition and the electric power output apparatus 30 (see FIG. 6). In a case where the measured value falls within the allowable range, the evaluating unit 17 decides that the electric power output apparatus 30 can output at the specified value. In contrast, in a case where the measured value does not fall within the allowable range, the evaluating unit 17 decides that the electric power output apparatus 30 cannot output at the specified value.

Here, as the case where the measured value falls within the allowable range, there are defined a case where the measured values of all of the plural items fall within allowable ranges, or a case where measured values of a predetermined number or more of the plural items, or a predetermined proportion or more of the plural items fall within allowable ranges, and the like.

In a case where it is decided that an output cannot be performed at the specified value, the evaluating unit 17 may calculate an indication of how much there is a deviation from the specified value. For example, the evaluating unit 17 may calculate a reliability (=(measured value) (specified value)) for each item. Then, the evaluating unit 17 also may use a statistical value (for example, an average value, a maximum value, a minimum value, the most frequent value, a median value, and the like) of reliabilities calculated for plural items as an evaluated value of the electric power output apparatus 30. For example, the statistical value of reliabilities of at least two items of active electric power, reactive electric power, the voltage and the ramp may be used as the evaluated value. This indicates that, in a case where a specified value is given to the electric power output apparatus 30, output may deviate from the specified value to the extent of the product of the specified value and the evaluated value (a value may decrease).

The output unit 13 transmits an evaluation result by the evaluating unit 17 to the terminal apparatus 20. This makes it possible for the terminal apparatus 20 to grasp the output performance of the electric power output apparatus 30 to be controlled. The storage unit 24 may store the output performance of the electric power output apparatus 30 to be controlled. The terminal apparatus 20 may transmit the evaluation result received from the server 10 to the electric power output apparatus 30.

Note that, in a case where, after the electric power output apparatus 30 is connected to the electric power distribution network, the electric power output apparatus 30 transmits the attribute information of the own apparatus to the terminal apparatus 20 at a preset predetermined timing, periodically (for example, once a year, once every three months, and the like), the server 10 may periodically evaluate the electric power output performance of the electric power output apparatus 30 in response to the reception of the attribute information. This makes it possible for the server 10 or the terminal apparatus 20 to detect degradation of the electric power output performance due to deterioration over time, or degradation of output performance due to some troubles such as failure.

In an example where, after the connection to the electric power distribution network, the evaluation of the electric power output performance is repeatedly performed, the storage unit 14 may accumulate past evaluation results of each electric power output apparatus 30 in association with evaluation timings. Then, the evaluating unit 17 may evaluate the electric power output performance of the electric power output apparatus 30 by using past evaluation results.

For example, machine learning is performed using training data associating an elapsed time from an arbitrary timing (for example, the first evaluation timing) with an evaluation result (reliability) at that timing, and a prediction model of the evaluation result at an arbitrary timing may be generated. Then, the evaluating unit 17 may estimate the evaluation result at the next evaluation timing by using the prediction model. Thereafter, the evaluating unit 17 may calculate the current evaluation result of the electric power output apparatus 30 on the basis of the estimated evaluation result of the next evaluation timing and an evaluation result based on the current newly received processing result. For example, the average value of these two evaluation results may be used as the evaluation result.

Figure 7:
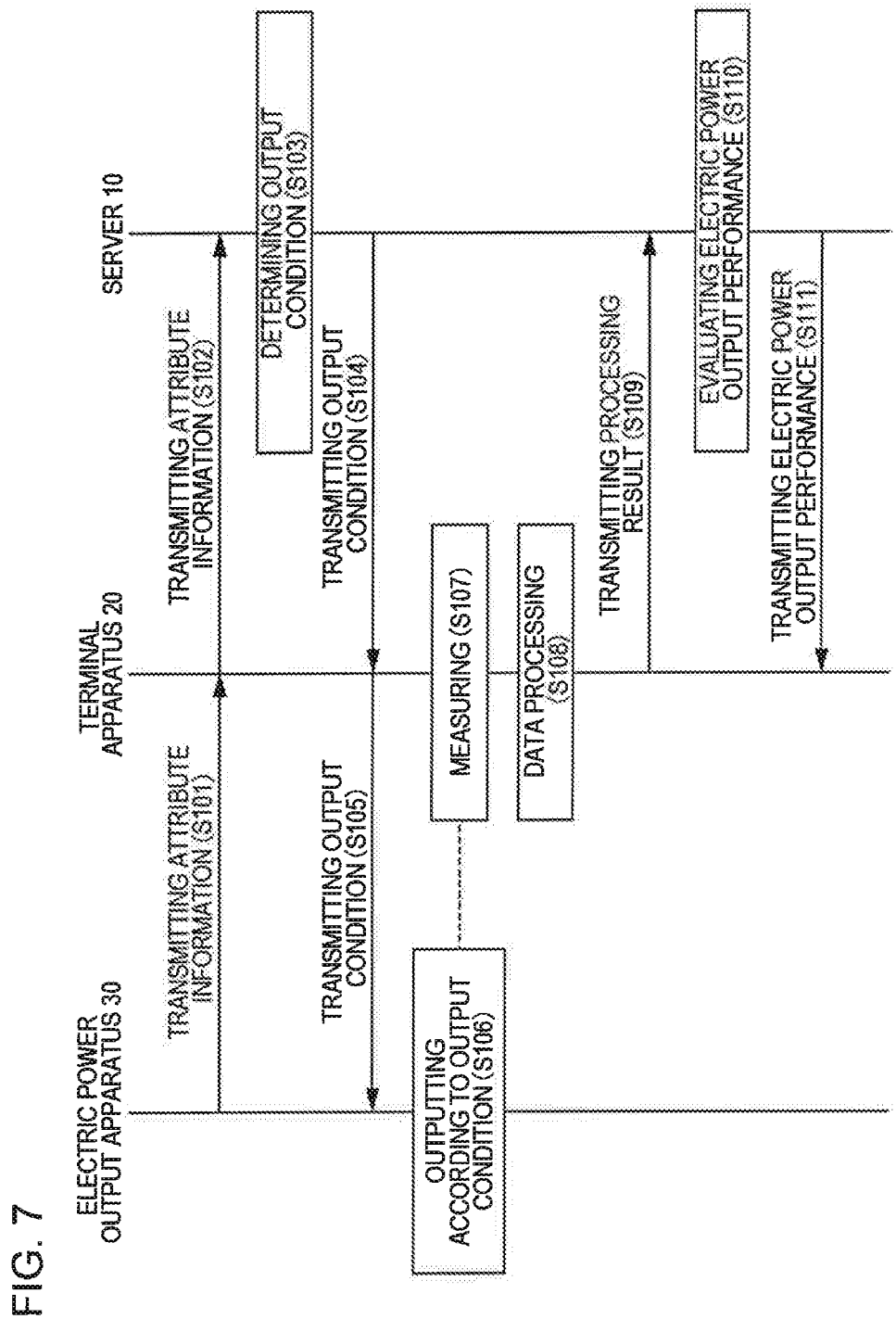
FIG. 7 is a sequence diagram illustrating an example of a processing flow of a management system according to the example embodiment.

Next, an example of a process flow of the management system according to the example embodiment will be described with reference to the sequence diagram of FIG. 7.

First, the electric power output apparatus 30 transmits the attribute information of the own apparatus to a predetermined terminal apparatus 20 at an arbitrary timing (S101). The terminal apparatus 20 transmits the received attribute information to the server 10 (S102).

In a case where the server 10 receives the attribute information, the server 10 determines a predetermined output condition on the basis of the content of the attribute information (S103). For example, on the basis of the information illustrated in FIGS. 4 and 5, an output condition corresponding to the model name of an electric power output apparatus 30 included in the received attribute information is determined. In the output condition, values of at least one item of active electric power, reactive electric power, the voltage, the frequency, and the ramp are specified.

Thereafter, the server 10 transmits the determined output condition to the terminal apparatus 20 (S104). Then, the terminal apparatus 20 transmits the received output condition to the electric power output apparatus 30 (S105).

Thereafter, the electric power output apparatus 30 performs an output operation (test operation) of electric power according to the received output condition (S106). The terminal apparatus 20 measures an output of the test operation of electric power in S106 and obtains output waveform data (alternating current waveform data) (S107). Subsequently, the terminal apparatus 20 performs predetermined processing on the received output waveform data to calculate a value of a predetermined item (S108). Herein, measured values of at least one item of active electric power, reactive electric power, a voltage, a frequency, and a ramp are calculated.

Thereafter, the terminal apparatus 20 transmits the calculated values as a processing result to the server 10 (S109). The server 10 evaluates the electric power output performance of the electric power output apparatus 30 on the basis of the processing result which is received (S110). For example, it is evaluated as an indication whether or not output is performed at the specified value, or how much there is a deviation from the specified value, and the like. The server 10 may store the evaluation result in association with the electric power output apparatus 30 (storage unit 14).

Thereafter, the server 10 transmits the evaluation result (electric power output performance) to the terminal apparatus 20 (S111). The terminal apparatus 20 may store the evaluation result in association with the electric power output apparatus 30 (storage unit 24).

Although not illustrated, after receiving the evaluation result, the terminal apparatus 20 may calculate the electric power output performance of one or plural electric power output apparatuses 30 as a whole to be controlled and report the calculated electric power output performance to the server 10. The electric power output performance may be considered as an electric power output performance which the terminal apparatus 20 can process. In this case, the server 10 stores the received information in association with each terminal apparatus 20 (storage unit 14).

For example, the terminal apparatus 20 may calculate a total of rated output (W), a total of capacities, and the like of one or plural electric power output apparatuses 30 to be controlled and report the total to the server 10. Note that, the total of a rated output (W) is obtained as a total of a "rated output (W) of an electric power output apparatus 30 decided to be able to output at the specified value" and a "value obtained by multiplying a rated output (W) of an electric power output apparatus 30 decided to be unable to output at the specified value by the reliability (=(measured value)/(specified value))".

The server 10 manages a total of rated output (W), a total of capacities, and the like in association with each terminal apparatus 20. Then, on the basis of the information, the server 10 provides a predetermined service such as demand response. For example, the server 10 makes a request of outputting (electric power supply to the electric power distribution network) at predetermined electric power (W), to a certain terminal apparatus 20. At this time, the server 10 requests that the output does not exceed the total of rated output (W).

The terminal apparatus 20 that received the request controls the electric power output apparatus 30 to be controlled such that the electric power output apparatus 30 outputs a predetermined electric power (W). At this time, the terminal apparatus 20 determines output electric power (W) to be notified to each electric power output apparatus 30 on the basis of the reliability.

It is considered, for example, a case of outputting at 100 W. In a case where an electric power output apparatus 30 decided to be able to output at the specified value is caused to output, the terminal apparatus 20 notifies the electric power output apparatus 30 of "100 W" as it is, and controls the apparatus so as to output at the electric power.

In contrast, in the case where an electric power output apparatus 30 decided to be unable to output at the specified value is caused to output, the terminal apparatus 20 does not notify the electric power output apparatus 30 of "100 W" as it is, and notifies the electric power output apparatus 30 of a corrected value obtained by correcting the value with the reliability. For example, the terminal apparatus 20 notifies the electric power output apparatus 30 of a value obtained by multiplying 100 W by the reciprocal of the reliability, and controls the apparatus so as to output the electric power. Note that, herein, although a case of requesting output in which an output value (W) is specified has been described as an example, the same processing may be performed as well in a case of requesting output in which other items such as a ramp is specified.

According to the example embodiment described above, the server 10 and the terminal apparatus 20 may evaluate and grasp the electric power output performance of the electric power output apparatus 30 connected to the electric power distribution network. Since a service such as demand response using the electric power output apparatus 30 is performed on the basis of this evaluation result, the quality of the service can be maintained.

Second Example Embodiment

The management system of the example embodiment is different from that of the first example embodiment in that part of the evaluation of the electric power output performance of the electric power output apparatus 30 is performed by the terminal apparatus 20. The overall picture of the management system according to the example embodiment is similar to that of the first example embodiment.

Figure 8:
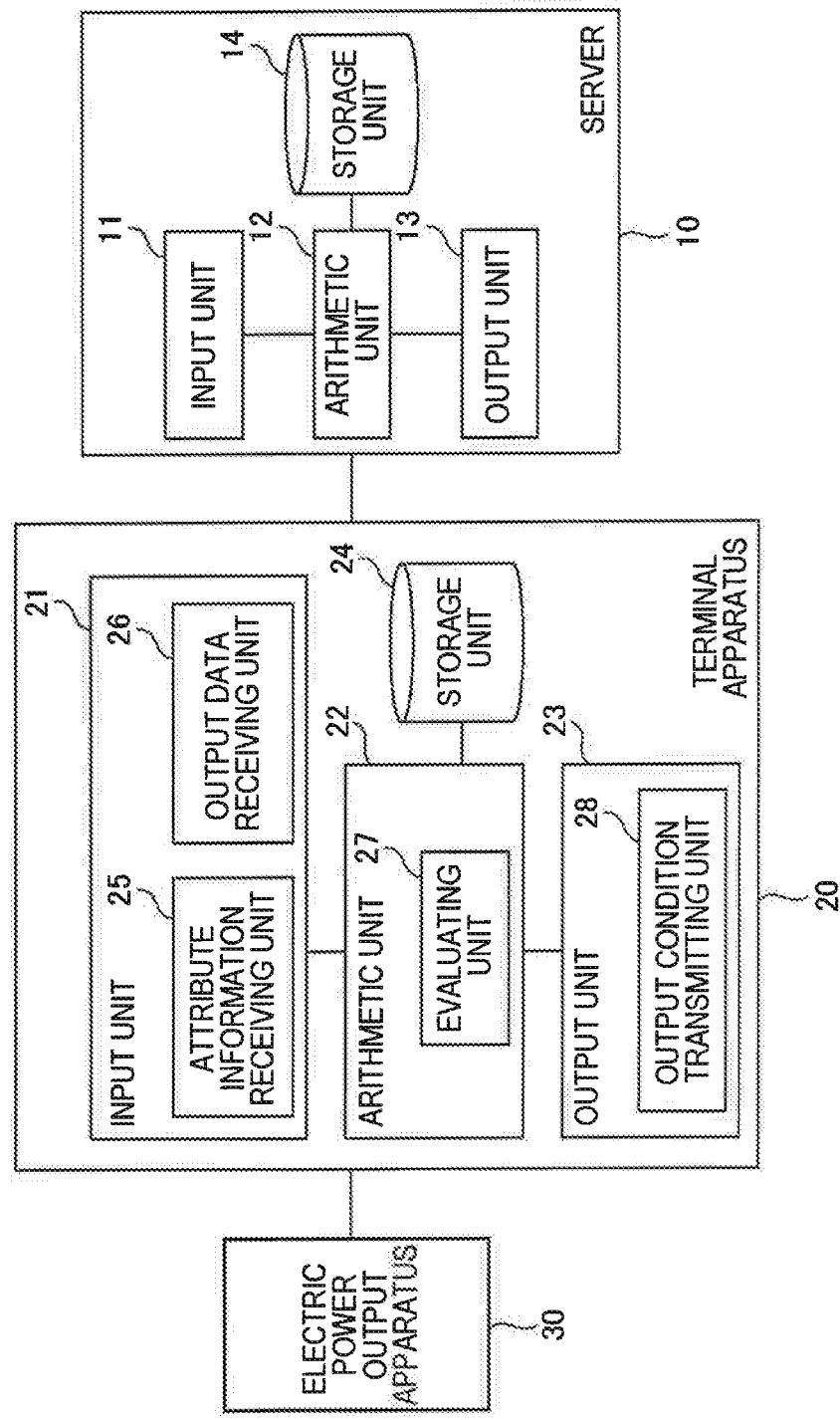
FIG. 8 is an example of a functional block diagram of a management according to the example embodiment.

FIG. 8 illustrates an example of a functional block diagram of the management system according to the example embodiment. As illustrated, the server 10 includes an input unit 11, an arithmetic unit 12, an output unit 13, and a storage unit 14. The input unit 11 receives an input of data. The arithmetic unit 12 performs predetermined arithmetic processing. The output unit 13 outputs data. The storage unit 14 stores data. Explanation of specific processing performed by each unit of the server 10 is appropriately performed at the time of describing the configuration of the following terminal apparatus 20.

The terminal apparatus 20 includes an input unit 21, an arithmetic unit 22, an output unit 23, and a storage unit 24. The input unit 21 receives an input of data. The arithmetic unit 22 performs predetermined arithmetic processing. The output unit 23 outputs data. The storage unit 24 stores data. The input unit 21 includes an attribute information receiving unit 25 and an output data receiving unit 26. The arithmetic unit 22 has an evaluating unit 27. The output unit 23 includes an output condition transmitting unit 28.

The attribute information receiving unit 25 receives, from an electric power output apparatus 30, the attribute information of the own apparatus (the electric power output apparatus 30). The configuration in which the terminal apparatus 20 receives the attribute information from the electric power output apparatus 30 is similar to that of the first example embodiment.

The terminal apparatus 20 transmits the attribute information received from the electric power output apparatus 30 to the server 10. Then, the server 10 determines an output condition in accordance with the attribute information, and transmits the output condition to the terminal apparatus 20. Then, the terminal apparatus 20 receives the output condition transmitted from the server 10. These processes are similar to those of the first example embodiment.

The output condition transmitting unit 28 transmits the output condition determined in accordance with the attribute information received by the attribute information receiving unit 25 to the electric power output apparatus 30 that has transmitted the attribute information.

The output data receiving unit 26 receives output waveform data at the time when the electric power output apparatus 30 performs an output operation (test operation) of electric power according to the output condition. Specifically, the output data receiving unit 26 receives alternating current waveform data output from the power conditioner of the electric power output apparatus 30. For example, the output data receiving unit 26 receives the waveform data from a measuring sensor installed at any position at which the alternating current waveform data can be measured.

The evaluating unit 27 evaluates the electric power output performance of the electric power output apparatus 30 on the basis of the output waveform data received by the output data receiving unit 26 and the output condition.

First, the evaluating unit 27 performs predetermined processing on the output waveform data to calculate values (measured values) such as active electric power, reactive electric power, a voltage, a frequency, a ramp. Then, the output unit 23 transmits these values as a processing result to the server 10.

The arithmetic unit 12 of the server 10 evaluates whether or not the electric power output apparatus 30 can output at the specified value on the basis of the processing result and the output condition. An example of the evaluation method is the same as that described in the first example embodiment.

Then, the output unit 13 of the server 10 transmits an evaluation result to the terminal apparatus 20. In a case where the evaluation result received from the server 10 indicates that the electric power output apparatus 30 can output at the specified value, the evaluating unit 27 ends processing.

In contrast, in a case where the evaluation result received from the server 10 indicates that the electric power output apparatus 30 cannot output at the specified value, the evaluating unit 27 evaluates as an indication how much there is a deviation from the specified value, and the like. An example of the evaluation method is the same as that described in the first example embodiment.

Figure 9:
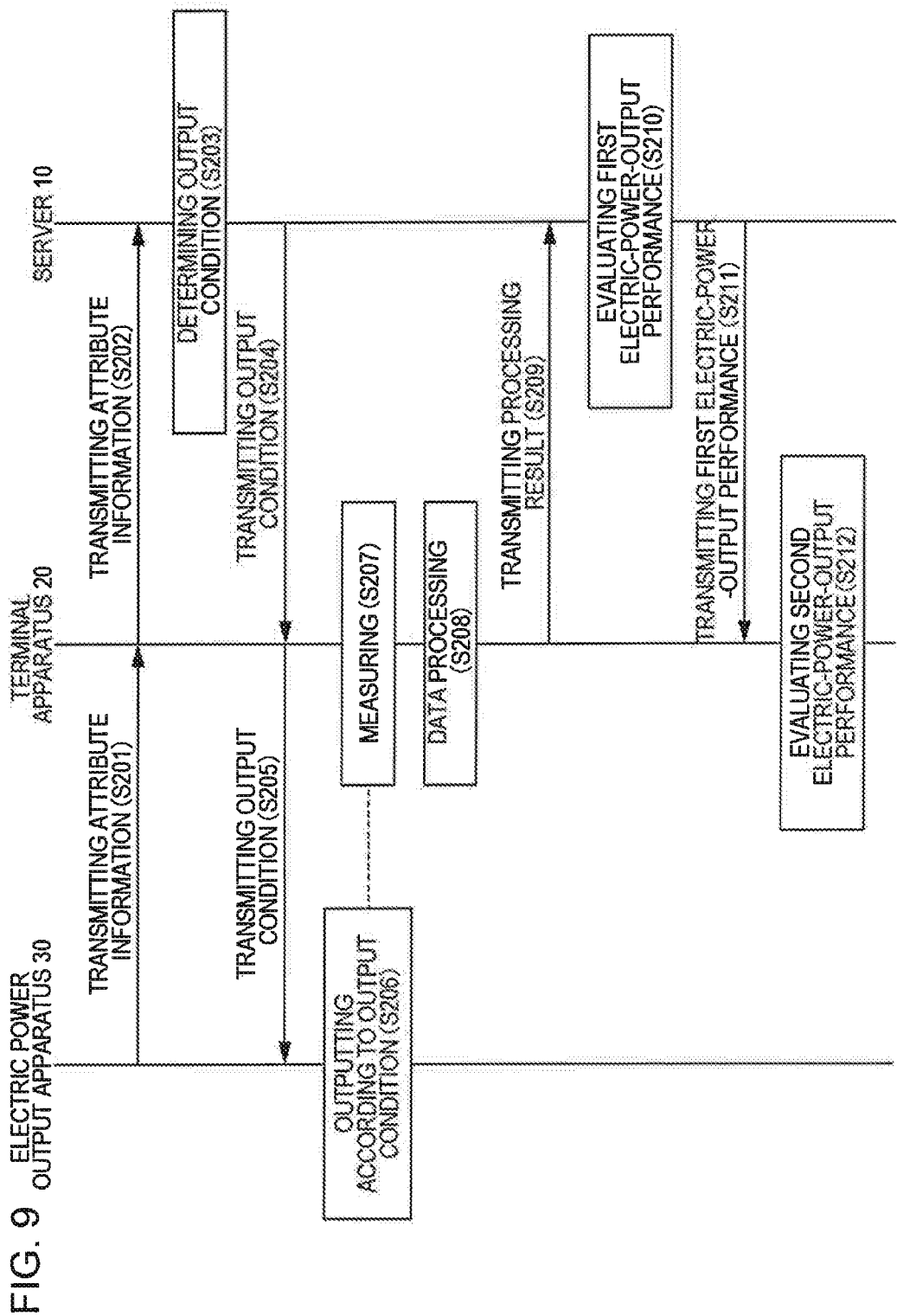
FIG. 9 is a sequence diagram illustrating an example of a processing flow according to a management system of the example embodiment.

Next, an example of a process flow of the management system according to the example embodiment will be described with reference to the sequence diagram of FIG. 9.

First, the electric power output apparatus 30 transmits attribute information of the own apparatus to a predetermined terminal apparatus 20 at an arbitrary timing (S201). The terminal apparatus 20 transmits the received attribute information to the server 10 (S202).

When the server 10 receives the attribute information, the server 10 determines a predetermined output condition on the basis of the content of the attribute information (S203). For example, on the basis of the information illustrated in FIGS. 4 and 5, an output condition corresponding to the model name of an electric power output apparatus 30 included in the received attribute information is determined. In the output condition, values of at least one item of active electric power, reactive electric power, the voltage, the frequency, and the ramp are specified.

Thereafter, the server 10 transmits the determined output condition to the terminal apparatus 20 (S204). Then, the terminal apparatus 20 transmits the received output condition to the electric power output apparatus 30 (S205).

Thereafter, the electric power output apparatus 30 performs an electric power output operation according to the received output condition (S206). The terminal apparatus 20 measures an output during the electric power output operation in S206 and obtains output waveform data (alternating current waveform data) (S207). Subsequently, the terminal apparatus 20 performs predetermined processing on the received output Waveform data to calculate a value of a predetermined item (S208). Herein, measured values of at least one item of active electric power, reactive electric power, a voltage, a frequency, and a ramp are calculated.

Thereafter, the terminal apparatus 20 transmits the calculated value as a processing result to the server 10 (S209). The server 10 evaluates a first electric-power-output performance of the electric power output apparatus 30 on the basis of the received processing result (S110). Herein, it is evaluated whether or not output is performed at the specified value. For example, the server 10 checks whether the measured value of each item indicated by the processing result falls within the allowable range corresponding to the output condition and the electric power output apparatus 30, using reference information (see FIG. 6) indicating, for each output condition, the standard range within which the value (measured value) of each item falls in a case where a normal (not deteriorated, failed, and the like) electric power output apparatus 30 performs an output operation of electric power according to the output condition. In a case where the measured value falls within the allowable range, the server 10 decides that the electric power output apparatus 30 can output at the specified value. In contrast, in a case where the measured value does not fall within the allowable range, the server 10 decides that the electric power output apparatus 30 cannot output at the specified value. The definition of "a case where the measured value fall within the allowable range" is as described above. The server 10 may store the evaluation result in association with the electric power output apparatus 30 (storage unit 14).

Thereafter, the server 10 transmits the evaluation result (the first electric-power-output performance) to the terminal apparatus 20 (S110). The terminal apparatus 20 may store the evaluation result (the first electric-power-output performance) association with the electric power output apparatus 30 (storage unit 24).

Thereafter, the terminal apparatus 20 evaluates a second electric-power-output performance on the basis of the processing result and the output condition as necessary. That is, in a case where the evaluation result (the first electric-power-output performance) received in S211 indicates that the electric power output apparatus 30 cannot output at the specified value, the terminal apparatus 20 calculates an indication (a second electric-power-output performance) of how much there is a deviation from the specified value. For example, the terminal apparatus 20 may calculate a reliability (=(measured value)/(specified value)) for each item. Then, the terminal apparatus 20 may calculate a statistical value (for example, an average value, a maximum value, a minimum value, the most frequent value, a median value, and the like) of reliabilities calculated for plural items as the evaluated value of the electric power output apparatus 30 (the second electric power output performance).

In contrast, in a case where the evaluation result (the first electric-power-output performance) received in S211 indicates that the electric power output apparatus 30 can output at the specified value, the terminal apparatus 20 does not evaluate the second electric-power-output performance.

It should be noted that, although not illustrated, the terminal apparatus 20 may transmit the second electric-power-output performance to at least one of the server 10 and the electric power output apparatus 30.

Although not illustrated, the terminal apparatus 20 may calculate an output performance of one or plural electric power output apparatuses 30 as a whole to be controlled after S211 or S212, and report the output performance to the server 10.

After that, an output request of electric power from the server 10 and the processing of the terminal apparatus 20 (control of the electric power output apparatus 30) in response to the output request of electric power are described as in the first example embodiment.

According to the example embodiment described above, advantageous effects similar to those of the first example embodiment can be realized. According to the example embodiment, the server 10 shares the evaluation of the electric power output performance of the electric power output apparatus 30 with the terminal apparatus 20. For this reason, it is possible to reduce any inconvenience that loads concentrate on the server 10.

Third Example Embodiment

In the first and second example embodiments, the electric power output performance of the electric power output apparatus 30 was evaluated on the basis of the output condition and the output waveform data. On the other hand, in the example embodiment, it is determined whether declaration content (attribute information) of the electric power output apparatus 30 is true or false on the basis of the output condition and the output waveform data. In a case where the declaration content is true, the electric power output apparatus 30 is permitted to connect to the electric power distribution network. In contrast, in a case where the declaration content is false, the electric power output apparatus 30 is not permitted to connect to the electric power distribution network. Hereinafter, it will be described.

The overall picture of the management system according to the example embodiment is similar to those of the first and second example embodiments.

FIG. 3 illustrates an example of a functional block diagram of the management system according to the example embodiment. As illustrated, the terminal apparatus 20 includes an input unit 21, an arithmetic unit 22, an output unit 23, and a storage unit 24. The input unit 21 receives an input of data. The arithmetic unit 22 performs predetermined arithmetic processing. The output unit 23 outputs data. The storage unit 24 stores data. Explanation of specific processing performed by each unit of the terminal apparatus 20 is appropriately performed at the time of describing the configuration of the following server 10.

The server 10 includes an input unit 11, an arithmetic unit 12, an output unit 13, and a storage unit 14. The input unit 11 receives an input of data. The arithmetic unit 12 performs predetermined arithmetic processing. The output unit 13 outputs data. The storage unit 14 stores data. The input unit 11 includes an attribute information receiving unit 15 and a processing result receiving unit 16. The arithmetic unit 12 includes an evaluating unit 17. The output unit 13 has an output condition transmitting unit 18.

The configurations of the attribute information receiving unit 15, the processing result receiving unit 16, and the output condition transmitting unit 18 are similar to those of the first example embodiment.

The evaluating unit 17 determines whether the attribute information received by the attribute information receiving unit 15 is true or false on the basis of the processing result received by the processing result receiving unit 16 and the output condition transmitted by the output condition transmitting unit 18. The evaluating unit 17 performs the determination using the reference information as illustrated in FIG. 6.

The evaluating unit 17 checks whether the measured value of each item indicated by the processing result falls within an allowable range corresponding to the output condition and the electric power output apparatus 30. In a case where the measured value falls within the allowable range, the evaluating unit 17 determines that the attribute information received by the attribute information receiving unit 15 (attribute information of the electric power output apparatus 30 declared by the own apparatus) is true. In contrast, in a case where the measured value does not fall within the allowable range, the evaluating unit 17 determines that the attribute information received by the attribute information receiving unit 15 (attribute information of the electric power output apparatus 30 declared by the own apparatus) is false.

Here, as the case where the measured value falls within the allowable range, there are considered a case where the measured values of all of the plural items fall within allowable ranges, or a case where measured values of a predetermined number or more of the plural items, or a predetermined proportion or more of the plural items fall within the allowable ranges, and the like.

In a case where the attribute information is true, the output unit 13 sends, through the terminal apparatus 20 to the electric power output apparatus 30, a notification to permit connection to the electric power distribution network. In contrast, in a case where the attribute information is false, the output unit 13 sends, through the terminal apparatus 20 to the electric power output apparatus 30, a notification not to permit connection to the electric power distribution network.

It should be noted that, the evaluating unit 17 may determine authenticity on the basis of the first electric-power-output performance described in the first and second example embodiments.

Figure 10:
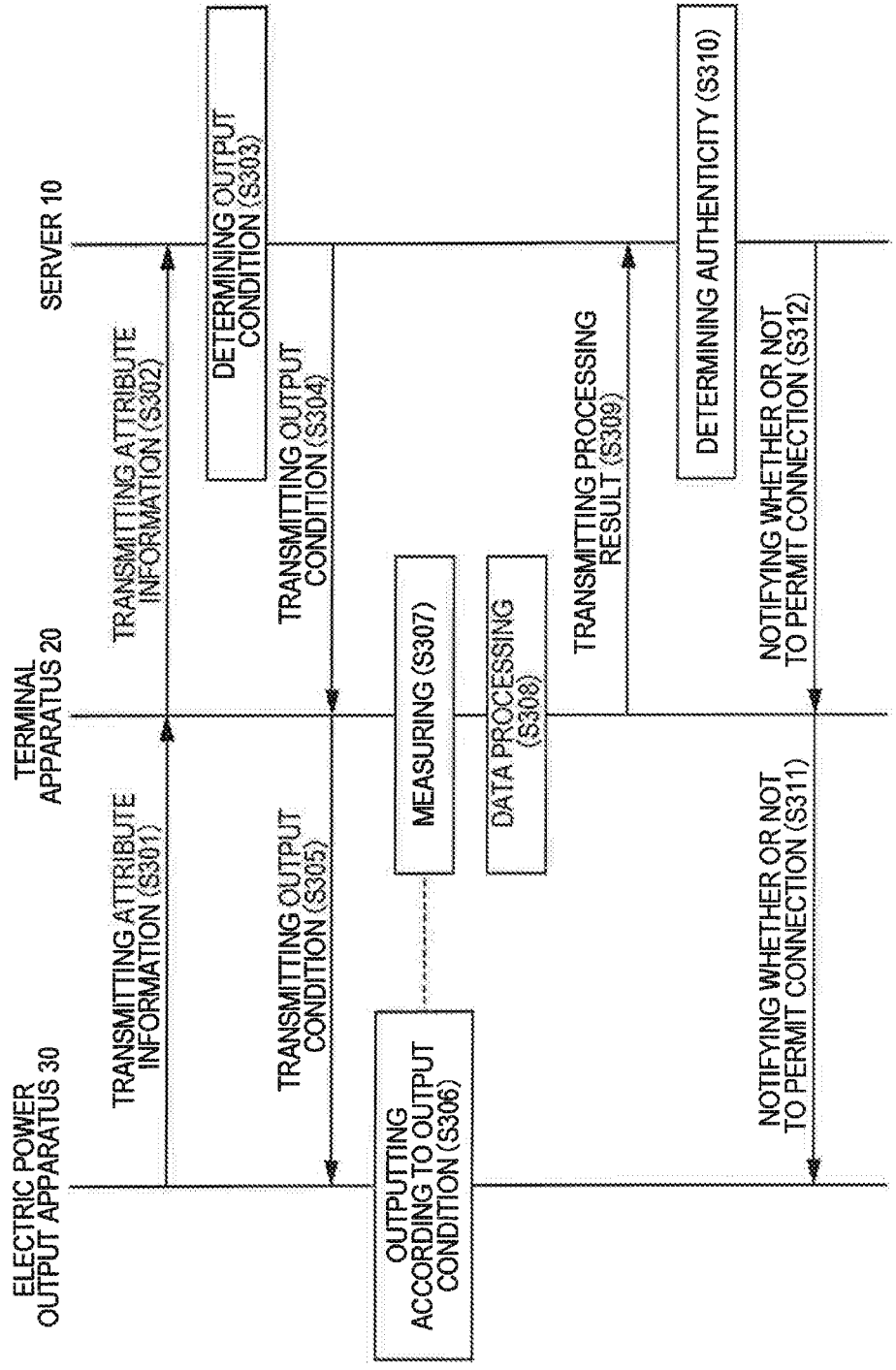
FIG. 10 is a sequence diagram illustrating an example of a processing flow of a management system according to the example embodiment.

Next, an example of a processing flow of the management system according to the example embodiment will be described with reference to the sequence diagram of FIG. 10.

First, the electric power output apparatus 30 transmits attribute information of the own apparatus to a predetermined terminal apparatus 20 at an arbitrary timing (S301). The terminal apparatus 20 transmits the received attribute information to the server 10 (S302).

When the server 10 receives the attribute information, the server 10 determines a predetermined output condition on the basis of the content of the attribute information (S303). For example, on the basis of the information illustrated in FIGS. 4 and 5, an output condition corresponding to the model name of an electric power output apparatus 30 included in the received attribute information is determined. In the output condition, values of at least one item of active electric power, reactive electric power, the voltage, the frequency, and the ramp are specified.

Thereafter, the server 10 transmits the determined output condition to the terminal apparatus 20 (S304). Then, the terminal apparatus 20 transmits the received output condition to the electric power output apparatus 30 (S305).

Thereafter, the electric power output apparatus 30 performs an electric power output operation according to the received output condition (S306). The terminal apparatus 20 measures an output during the electric power output operation in S306 and obtains output waveform data (alternating current waveform data) (S307). Subsequently, the terminal apparatus 20 performs predetermined processing on the received output waveform data to calculate a value of a predetermined item (S308). Herein, measured values of at least one item of active electric power, reactive electric power, a voltage, a frequency, and a ramp are calculated.

Thereafter, the terminal apparatus 20 transmits the calculated value as a processing result to the server 10 (S309).

The server 10 determines whether the attribute information transmitted by the electric power output apparatus 30 is true or false on the basis of the received processing result (S310).

In a case where it is determined in S310 that the attribute information is true, the server 10 transmits, to the terminal apparatus 20, a notification to permit the electric power output apparatus 30 to connect to the electric power distribution network (S311). In contrast, in a case where it is determined in S310 that the attribute information is false, the server 10 transmits, to the terminal apparatus 20, a notification not to permit the electric power output apparatus 30 to connect to the electric power distribution network (S311).

The terminal apparatus 20 transmits, to the electric power output apparatus 30, the notification received from the server 10 as to whether or not to permit connection to the electric power distribution network (S312).

According to the example embodiment described above, it is possible to detect an electric power output apparatus 30 misrepresenting declaration content (attribute information of the own apparatus), and thereby to prevent the electric power output apparatus 30 from connecting to the electric power distribution network. It is likely that the electric power output apparatus 30 misrepresenting declaration content has poor quality and is unable to output electric power at the specified value. In a case where such an electric power output apparatus 30 is connected to the electric power distribution network, it is considered that ignition and explosion may be caused in the worst case by the electric power output apparatus 30 of poor quality, in addition to deterioration in quality of a service such as demand response performed by the server 10.

According to the example embodiment, it is possible to reduce any inconvenience as described above by avoiding the connection of such an electric power output apparatus 30 to the electric power distribution network.

Fourth Example Embodiment

The management system of the example embodiment is different from that of the third example embodiment in that part of the evaluation of the electric power output performance of the electric power output apparatus 30 is performed by the terminal apparatus 20. The overall picture of the management system according to the example embodiment is similar to those of the first to third example embodiments.

FIG. 8 illustrates an example of a functional block diagram of the management system according to the example embodiment. As illustrated, the server 10 includes an input unit 11, an arithmetic unit 12, an output unit 13, and a storage unit 14. The input unit 11 receives an input of data. The arithmetic unit 12 performs predetermined arithmetic processing. The output unit 13 outputs data. The storage unit 14 stores data. Specific processing performed by each unit of the server 10 is appropriately performed at the time of describing the configuration of the following terminal apparatus 20.

The terminal apparatus 20 includes an input unit 21, an arithmetic unit 22, an output unit 23, and a storage unit 24. The input unit 21 receives an input of data. The arithmetic unit 22 performs predetermined arithmetic processing. The output unit 23 outputs data. The storage unit 24 stores data. The input unit 21 includes an attribute information receiving unit 25 and an output data receiving unit 26. The arithmetic unit 22 has an evaluating unit 27. The output unit 23 includes an output condition transmitting unit 28.

The configurations of the attribute information receiving unit 25, the output data receiving unit 26, and the output condition transmitting unit 28 are similar to those of the second example embodiment.

The evaluating unit 27 determines whether the attribute information received by the attribute information receiving unit 25 is true or false. For example, the evaluating unit 27 performs predetermined processing on the output waveform data received by the output data receiving unit 26 to calculate values (measured values) such as active electric power, reactive electric power, a voltage, a frequency, a ramp. Then, the output unit 23 transmits these values as a processing result to the server 10.

Referring to reference information (see FIG. 6) corresponding to the transmitted output condition, the server 10 extracts identification information (a model name, and the like) of an electric power output apparatus 30 of which a processing result falls within an allowable range. For example, using the processing result and the allowable range of the electric power output apparatus 30 of a model name "ABC0001" illustrated in FIG. 6, the server 10 determines whether the processing result falls within the allowable range of the electric power output apparatus 30. In a case where it is determined that the processing result falls within the allowable range, the identification information of the electric power output apparatus 30 is extracted. The server 10 also performs the processing on the other electric power output apparatuses 30.

It should be noted that, as the case where the measured value falls within the allowable range, there are considered a case where the measured values of all of the plural items fall within allowable ranges, or a case where the measured values of a predetermined number or more of the plural items, or a predetermined proportion or more of the plural items fall within allowable ranges, and the like.

Then, the server 10 transmits, to the terminal apparatus 20, a list (collation data) of the extracted identification information (a model name, and the like) of the electric power output apparatus 30.

The evaluating unit 27 determines whether the identification information (a model name, and the like) of the electric power output apparatus 30 included in the attribute information received from the electric power output apparatus 30 is present in the collation data. In a case where the identification information is present, the evaluating unit 27 determines that the attribute information received by the attribute information receiving unit 25 (attribute information of the electric power output apparatus 30 declared by the own apparatus) is true. In contrast, in a case where the identification information is not present, the evaluating unit 27 determines that the attribute information received by the attribute information receiving unit 25 (attribute information of the electric power output apparatus 30 declared by the own apparatus) is false.

In a case where the attribute information is true, the output unit 23 sends, to the electric power output apparatus 30, a notification to permit connection to the electric power distribution network. In contrast, in a case where the attribute information is false, the output unit 23 sends, to the electric power output apparatus 30, a notification not to permit connection to the electric power distribution network.

Next, an example of the processing flow of the management system according to the example embodiment will be described with reference to the sequence diagram of FIG. 11.

First, the electric power output apparatus 30 transmits attribute information of the own apparatus to a predetermined terminal apparatus 20 at an arbitrary timing (S401). The terminal apparatus 20 transmits the received attribute information to the server 10 (S402).

In a case where the server 10 receives the attribute information, the server 10 determines a predetermined output condition on the basis of the content of the attribute information (S403). For example, on the basis of the information illustrated in FIGS. 4 and 5, an output condition corresponding to the model name of an electric power output apparatus 30 included in the received attribute information is determined. In the output condition, values of at least one item of active electric power, reactive electric power, the voltage, the frequency, and the ramp are specified.

Thereafter, the server 10 transmits the determined output condition to the terminal apparatus 20 (S404). Then, the terminal apparatus 20 transmits the received output condition to the electric power output apparatus 30 (S405).

Thereafter, the electric power output apparatus 30 performs an electric power output operation according to the received output condition (S406). The terminal apparatus 20 measures an output during the electric power output operation in S406 and obtains output waveform data (alternating current waveform data) (S407). Subsequently, the terminal apparatus 20 performs predetermined processing on the received output waveform data to calculate a value of a predetermined item (S408). Herein, measured values of at least one item of active electric power, reactive electric power, a voltage, a frequency, and a ramp are calculated.

Thereafter, the terminal apparatus 20 transmits the calculated value as a processing result to the server 10 (S409). The server 10 generates the collation data (list information of electric power output apparatuses 30 satisfying the predetermined condition) on the basis of the received processing result, and transmits the collation data to the terminal apparatus 20 (S410).

The terminal apparatus 20 determines authenticity of the attribute information received in S401, on the basis of the attribute information received in S401 and the collation data received in S410 (S411).

In a case where it is determined in S411 that the attribute information is true, the terminal apparatus 20 transmits, to the electric power output apparatus 30, a notification to permit connection to the electric power distribution network (S412). In contrast, in a case where it is determined in S411 that the attribute information is false, the terminal apparatus 20 transmits, to the electric power output apparatus 30, a notification not to permit connection to the electric power distribution network (S412).

According to the example embodiment described above, advantageous effects similar to those of the third example embodiment may be realized. According to the example embodiment, the server 10 shares the evaluation of the electric power output performance of the electric power output apparatus 30 with the terminal apparatus 20. For this reason, it is possible to reduce any inconvenience that loads concentrate on the server 10.

It should be noted that, in the first to fourth example embodiments, an example has been described in which the terminal apparatus 20 performs predetermined processing on the output waveform data to calculate values (measured values) such as active electric power, reactive electric power, a voltage, a frequency, a ramp, and these values are transmitted to the server 10 as the processing result. As a modification example, the terminal apparatus 20 may perform AD conversion (predetermined processing) on the output waveform data and transmit the results (digital waveform data) to the server 10. Then, the server 10 may analyze the received digital waveform data to calculate values (measured values) such as active electric power, reactive electric power, a voltage, a frequency, a ramp.

Hereinafter, an example of a reference embodiment will be appended.

1. A control apparatus including:

an attribute information receiving unit which receives attribute information of an electric power output apparatus from the electric power output apparatus having a function of outputting electric power;

an output condition transmitting unit which transmits an output condition determined in accordance with the attribute information to the electric power output apparatus;

a processing result receiving unit which receives a processing result obtained by performing predetermined processing on output waveform data at the time when the electric power output apparatus outputs electric power according to the output condition; and an evaluating unit which evaluates an electric power output performance of the electric power output apparatus on the basis of the processing result and the output condition.

2. The control apparatus described in 1,
in which, in the output condition, a value of at least one item of active electric power, reactive electric power, a voltage, a frequency, and a change in electric power during a predetermined time is specified.

3. The control apparatus described in 1 or 2,
in which the output waveform data is alternating current waveform data, and
the processing result receiving unit receives a measured value of at least one of active electric power, reactive electric power, a voltage, a frequency, and a change in electric power during a predetermined time calculated from the alternating current waveform data.

4. The control apparatus described in 1,
in which the evaluating unit determines authenticity of the attribute information on the basis of the electric power output performance of the electric power output apparatus.

5. The control apparatus described in any one of 1 to 4,
in which, for each output condition, an allowable range of output is defined corresponding to each of a plurality of items, and
the evaluating unit evaluates the electric power output performance of the electric power output apparatus on the basis of whether or not a processing result of the item calculated on the basis of the output waveform data falls within the allowable range.

6. The control apparatus described in 4,
in which, for each output condition, a specified value of output is defined corresponding to each of a plurality of items, and
the evaluating unit calculates a reliability on the basis of how much the processing result deviates from the specified value.

7. The control apparatus described in 6,
in which the evaluating unit repeatedly calculates the reliability based on how much the processing result deviates from the specified value and determines at least one of a failure and a deterioration of the electric power output apparatus on the basis of a change in the reliability.

8. The control apparatus described in 6 or 7,
further including: an output unit which outputs an evaluation result based on the processing result and the specified value.

9. The control apparatus described in 5,
further including: an output unit which transmits identification information of the electric power output apparatus of which the processing result falls within the allowable range.

10. The control apparatus described in 1,
in which the electric power output apparatus of which the attribute information is determined to be true is notified of permission to connect to an electric power distribution network.

11. A server having the control apparatus described in any one of 1 to 10.

12. A terminal apparatus including:
an attribute information receiving unit which receives attribute information of an electric power output apparatus from the electric power output apparatus having a function of outputting electric power;
an output condition transmitting unit which transmits an output condition determined in accordance with the attribute information to the electric power output apparatus;
an output data receiving unit which receives output waveform data at the time when the electric power output apparatus outputs electric power according to the output condition; and
an output unit which transmits a processing result obtained by performing predetermined processing on the output waveform data on the basis of the output condition.

13. The terminal apparatus described in 12,
in which, in the output condition, a value of at least one item of active electric power, reactive electric power, a voltage, a frequency, and a change in electric power during a predetermined time is specified.

14. The terminal apparatus described in 13,
in which the output data receiving unit receives alternating current waveform data as output waveform data, and
the output unit transmits a measured value of at least one item of active electric power, reactive electric power, a voltage, a frequency, and a change in electric power during a predetermined time as the processing result.

15. The terminal apparatus described in 13 or 14,
in which, for each output condition, a specified value of output is defined corresponding to each of a plurality of items, the terminal apparatus further including:
an evaluating unit which calculates a reliability on the basis of how much the processing result deviates from the specified value.

16. The terminal apparatus described in 13 or 14,
further including: an evaluating unit which determines whether identification information corresponding to the attribute information is included in a list of identification information of the electric power output apparatus of which the processing result falls within an allowable range.

17. The terminal apparatus described in 16,
in which, in a case where the identification information corresponding to the attribute information is included in the list, the output unit notifies the electric power output apparatus of permission to connect to an electric power distribution network.

18. The terminal apparatus described in 15,
in which the output unit transmits a total of rated output of electric power output apparatuses to be controlled and a total of capacities on the basis of the reliability.

19. An evaluation method which is executed by a computer, including:
an attribute information receiving step of receiving attribute information of an electric power output apparatus from the electric power output apparatus having a function of outputting electric power;
an output condition transmitting step of transmitting, to the electric power output apparatus, an output condition determined in accordance with the attribute information;
a processing result receiving step of receiving a processing result obtained by performing predetermined processing on output waveform data at the time when the electric power output apparatus outputs electric power according to the output condition; and
an evaluating step of evaluating an electric power output performance of the electric power output apparatus on the basis of the processing result and the output condition.

20. An evaluation method which is executed by a computer, including:
an attribute information receiving step of receiving attribute information of an electric power output apparatus from the electric power output apparatus having a function of outputting electric power;

an output condition transmitting step of transmitting, to the electric power output apparatus, an output condition determined in accordance with the attribute information;

an output data receiving step of receiving output waveform data at the time when the electric power output apparatus outputs electric power according to the output condition; and an output step of transmitting a processing result obtained by performing predetermined processing on the output waveform data on the basis of the output condition.

21. A program that causes a computer to function as:

an attribute information receiving unit which receives attribute information of an electric power output apparatus from the electric power output apparatus having a function of outputting electric power;

an output condition transmitting unit which transmits, to the electric power output apparatus, an output condition determined in accordance with the attribute information;

a processing result receiving unit which receives a processing result obtained by performing predetermined processing on output waveform data at the time when the electric power output apparatus outputs electric power according to the output condition; and an evaluating unit which evaluates an electric power output performance of the electric power output apparatus on the basis of the processing result and the output condition.

22. A program that causes a computer to function as:

an attribute information receiving unit which receives attribute information of an electric power output apparatus from the electric power output apparatus having a function of outputting electric power;

an output condition transmitting unit which transmits, to the electric power output apparatus, an output condition determined in accordance with the attribute information;

an output data receiving unit which receives output waveform data at the time when the electric power output apparatus outputs electric power according to the output condition; and an output unit which transmits a processing result obtained by performing predetermined processing on the output waveform data on the basis of the output condition.

This application claims priority based on Japanese Patent Application No. 2016-042201 filed on Mar. 4, 2016, the disclosure of which is incorporated herein in its entirety.

The invention claimed is:

1. A control apparatus comprising:

an attribute information receiving unit which receives attribute information of an electric power output apparatus from the electric power output apparatus having a function of outputting electric power;

an output condition transmitting unit which transmits an output condition determined in accordance with the attribute information to the electric power output apparatus;

a processing result receiving unit which receives a processing result obtained by performing predetermined processing on output waveform data at the time when the electric power output apparatus outputs electric power according to the output condition; and an evaluating unit which evaluates an electric power output performance of the electric power output apparatus on the basis of the processing result and the output condition.

2. The control apparatus according to claim 1, wherein, in the output condition, a value of at least one item of active electric power, reactive electric power, a voltage, a frequency, and a change amount of electric power during a predetermined time is specified.

3. The control apparatus according to claim 1, wherein the output waveform data is alternating current waveform data, and the processing result receiving unit receives a measured value of at least one of active electric power, reactive electric power, a voltage, a frequency, and a change amount of electric power during a predetermined time calculated from the alternating current waveform data.

4. The control apparatus according to claim 1, wherein the evaluating unit determines authenticity of the attribute information on the basis of the electric power output performance of the electric power output apparatus.

5. The control apparatus according to claim 1, wherein, for each output condition, an allowable range of output is defined corresponding to each of a plurality of items, and the evaluating unit evaluates the electric power output performance of the electric power output apparatus on the basis of whether or not a processing result of the item calculated on the basis of the output waveform data falls within the allowable range.

6. The control apparatus according to claim 4, wherein, for each output condition, a specified value of output is defined corresponding to each of a plurality of items, and the evaluating unit calculates a reliability on the basis of how much the processing result deviates from the specified value.

7. The control apparatus according to claim 6, wherein the evaluating unit repeatedly calculates the reliability based on how much the processing result deviates from the specified value and determines at least one of a failure and a deterioration of the electric power output apparatus on the basis of a change in the reliability.

8. The control apparatus according to claim 6 or 7, further comprising:

an output unit which outputs an evaluation result based on the processing result and the specified value.

9. The control apparatus according to claim 5, further comprising:

an output unit which transmits identification information of the electric power output apparatus of which the processing result falls within the allowable range.

10. The control apparatus according to claim 1, wherein the electric power output apparatus of which the attribute information is determined to be true is notified of permission to connect to an electric power distribution network.

11. A server having the control apparatus according to claim 1.

12. A terminal apparatus comprising:

an attribute information receiving unit which receives attribute information of an electric power output apparatus from the electric power output apparatus having a function of outputting electric power;

an output condition transmitting unit which transmits an output condition determined in accordance with the attribute information to the electric power output apparatus;

an output data receiving unit which receives output waveform data at the time when the electric power output apparatus outputs electric power according to the output condition; and an output unit which transmits a processing result obtained by performing predetermined processing on the output waveform data on the basis of the output condition.

13. The terminal apparatus according to claim 12, wherein, in the output condition, a value of at least one item of active electric power, reactive electric power, a voltage, a frequency, and a change amount of electric power during a predetermined time is specified.

14. The terminal apparatus according to claim 13, wherein the output data receiving unit receives alternating current waveform data as output waveform data, and the output unit transmits a measured value of at least one item of active electric power, reactive electric power, a voltage, a frequency, and a change amount of electric power during a predetermined time as the processing result.

15. The terminal apparatus according to claim 13, wherein, for each output condition, a specified value of output is defined corresponding to each of a plurality of items, the terminal apparatus further comprising:

an evaluating unit which calculates a reliability on the basis of how much the processing result deviates from the specified value.

16. The terminal apparatus according to claim 13, further comprising:

an evaluating unit which determines whether identification information corresponding to the attribute information is included in a list of identification information of the electric power output apparatus of which the processing result falls within an allowable range.

17. The terminal apparatus according to claim 16, wherein, in a case where the identification information corresponding to the attribute information is included in the list, the output unit notifies the electric power output apparatus of permission to connect to an electric power distribution network.

18. The terminal apparatus according to claim 15, wherein the output unit transmits a total of rated output of electric power output apparatuses to be controlled and a
total of capacities on the basis of the reliability.

* * * * *